United States Patent
Lyons et al.

[11] Patent Number: 5,910,337
[45] Date of Patent: Jun. 8, 1999

[54] PHASE-AVERAGING RESIST COATING FOR REFLECTIVITY CONTROL

[75] Inventors: Christopher Francis Lyons, LaGrangeville; Gary Thomas Spinillo, Wappingers Falls; Robert Lavin Wood, Poughkeepsie, all of N.Y.

[73] Assignee: International Business Machines Corporation, Armonk, N.Y.

[21] Appl. No.: 07/871,374

[22] Filed: Apr. 20, 1992

[51] Int. Cl.$^6$ .................................. B05D 1/32; B05D 5/00
[52] U.S. Cl. .......................... 427/259; 427/258; 427/282; 427/286; 427/407.1
[58] Field of Search .................................. 427/258, 259, 427/282, 286, 407.1

[56] References Cited

U.S. PATENT DOCUMENTS

| | | | |
|---|---|---|---|
| 4,308,586 | 12/1981 | Coates | 364/491 |
| 4,405,710 | 9/1983 | Balasubramanyam | 427/99 |
| 4,465,767 | 8/1984 | Oba et al. | 430/271 |
| 4,971,893 | 11/1990 | Taylor, Jr. et al. | 430/293 |
| 4,987,048 | 1/1991 | Shinozaki et al. | 430/166 |

FOREIGN PATENT DOCUMENTS 2130423   5/1984   United Kingdom .

*Primary Examiner*—Hien Tran
*Attorney, Agent, or Firm*—Steven Capella; Dale M. Crockatt

[57] ABSTRACT

A method is described for reducing linewidth variations in the patterning of photoresists having non-uniform film thickness, comprising overcoating the photoresist with sufficient thickness of a nonreactive coating composition having a refractive index which within ±15 percent of that of the refractive index of the photoreist composition; said overcoating being of sufficient thickness such that it will result in about a one wave length phase lag between the oblique rays and the normal incident rays reflecting back from the substrate, upon arriving back at the resist surface. The effective thickness of the overcoating is a function of the exposure wavelength and the size of the numerical aperture of the objective lens used for expose. The overcoating compositions capable of providing the so defined refractive indices ranges, are described. For example, a polyacrylic acid coating composition having a refractive index of 1.5 at a thickness of 2.0 $\mu$m, provides a workable overcoating to reduce linewidth variations for a resist having a refractive index of 1.7 and a film thickness of 0.9–1.0 $\mu$m.

11 Claims, 3 Drawing Sheets

PHASE-AVERAGING RESIST COATING FOR REFLECTIVITY CONTROL

FIELD OF INVENTION

This invention relates to a novel method of reducing linewidth variations in patterning of photoresists having non-uniform film thickness. This method comprises overcoating the photoresist composition with a sufficient thickness of a nonreactive material having a refractive index which is within ±15 percent of the refractive index of the photoresist composition; overcoating being of sufficient thickness such that it will result in about a one wave length phase lag between the oblique rays and the normal incident rays reflecting back from the substrate, upon arriving back at the resist surface. The effective thickness of the overcoating is a function of the exposure wavelength and the size of the numerical aperture of the objective lens used for exposure. The overcoating compositions capable of providing the so defined refractive index ranges, are described. For example, a polyacrylic acid composition having a refractive index of 1.5 and a thickness of 2.0 μm, provides a workable overcoating to reduce linewidth variations for a resist having a refractive index of 1.7 and a film thickness of 0.9–1.0 μm.

BACKGROUND ART

It is well recognized that state-of-the-art wafer steppers use monochromatic exposure light based on mercury arc lamps and excimer lasers. This limits the spectral range necessary for chromatic correction, simplifying lens design. The high degree of coherence associated with narrow band width leads to the well known thin film interference effects in photoresists. This in turn produces undesirable variability in exposure energy coupling within the resist on partially reflective substrates containing topographical features and/ or transmissive thin films of variable thickness.

Early techniques for dealing with this problem relied on the use of anti-reflective coatings (ARC) applied beneath the resist coating to absorb exposure light transmitted through the resist film. This prevents phase-coherent waves reflected from the substrate from mixing with waves reflected from the resist surface, reducing or eliminating interference. The use of these anti-reflective layers, while effective in controlling both bulk reflectance variability as well as interference effects, complicates lithography processing by imposing an additional subtractive film removal step. After exposure and development, the anti-reflective layer is typically removed leading to additional erosion and potential increase in etch bias.

More recent techniques rely on the reduction of surface waves from the resist film surface rather than the substrate, to prevent phase-mixing and interference. The technique, termed "anti-reflective coating on resist" (ARCOR) is based on the well known method of applying a quarter-wave optical thickness of material having a refractive index which is close to the square-root of the underlying material. Thus, for a photoresist with a typical index of refraction of about 1.7, applying a quarter-wave thickness of a coating with an index of refraction of 1.3, completely eliminates reflection from the resist surface, thereby eliminating interference with light reflected from the substrate. The problem with this technique is the difficulty in providing aqueous processable coating materials with sufficiently low refractive index values. While fluorocarbon polymers with index values close to 1.3 are available, these must be processed with exotic and expensive fluorocarbon solvents, complicating the aqueous based lithographic process. Aqueous processibility of fluorocarbon-based processability can only be attained by employing materials with a higher refractive index of about 1.4. This is, at best, a mere compromise.

The applicant is aware of several references which are listed below. The pertinence of these references to the current invention will be considered and discussed in the Summary of Invention section.

U.S. Pat. No 4,971,893 describes an acrylic coating to provide a "matte" finish on image bearing surfaces.

U.S. Pat. No 4,987,048 describes an acrylic binder for coloring materials in the photographic process.

U.S. Pat. No 4,465,767 employs acrylic pigment binders for optical recording systems.

British Pat. No. G.B. 2,130,430 teaches the use of acrylic polymers as substrate support materials for optical video disc.

SUMMARY OF THE INVENTION

In its broadest aspects this invention comprises a method for reducing linewidth variations in the patterning of photoresists having non-uniform film thickness. This method comprises overcoating the photoresist composition with a sufficient thickness of a nonreactive coating having a refractive index which is within ±15% of the refractive index of the photoresist composition in order to provide a one wavelength lag or delay of the resist reflected oblique rays as compared to the resist reflected incident rays. This coating thickness being a function of the exposure wavelength and the size of the numerical aperture of the objective lens used for expose. The overcoating compositions capable of providing the so defined refractive indices ranges, are described. Typical of such a phase-averaging resist coating for reflectivity control, is a polyacrylic acid composition having a refractive index of 1.5 at a thickness of 2.0 μm. This composition provides a workable overcoating to reduce linewidth variations for a resist having a refractive index of 1.7 and a film thickness of 0.9–1.0 μm.

Typical types of overcoating materials which are effective as phase-averaging resist coatings would include, homo or copolymers of acrylic acid and methacrylic acid with a variety of optional third component vinyl monomers such as alkyl acrylates and methacrylates including methyl methacrylate, butyl acrylate and hexyl acrylate as well as vinyl acetate and vinyl alcohol.

In the past, acrylate polymers have been employed as coatings for image bearing surfaces. However, their use was intended for totally different purpose and the compositions described could not possibly function to satisfy the needs of the present phase averaging resist coatings for reflectivity control. Typical of such uses is that described in U.S. Pat. No. 4,971,893. In this reference the objective is to provide a means of lowering the gloss or providing a "Matte" finish to conventional silver halide photographic pre-pressed proofs by employing an acrylic coating composed of a blend of incompatible polymers. This results in a desired dull coating surface. This teaching is far from that taught in the method of phase-averaging resist coatings for reflectivity control. A matte finish is totally undesirable since it causes light scattering interference, thus limiting image resolution.

Additionally, in U.S. Pat. No. 4,987,048 arylakyl methacrylate, an acrylic acid or methacrylic acid copolymer, is used as a polymeric binder or carrier the coloring materials in a photographic process, to prevent side etching of the color bearing layer during developing. Similarly, U.S. Pat. No. 4,465,767 involves the use water soluble polymers which include polyacrylic acid, cellulose, polyvinyl alcohol and starch to bind pigments in an optical information recording medium. It can be clearly seen that teachings of both of these patents are well outside of the scope or teachings of the present invention.

British Pat No. G.B. 2,130,423 describes a method manufacture of optical data recorder carrier such as an optical video disc. In the steps of its manufacture a transparent polymethyl methacrylate (PMMA) type resin is employed as the substrate support material upon which the photoresist materials are applied, replacing glass in the prior art. Here again the teaching of the use of PMMA support material for optical video disc manufacture does not in any manner suggest or teach the use of polyacrylic acid coatings defined for use as phase-averaging resist coatings for reflectivity control of thin film interference in wafer production.

DETAILED DESCRIPTION OF THE PRESENT INVENTION

Figure 1:
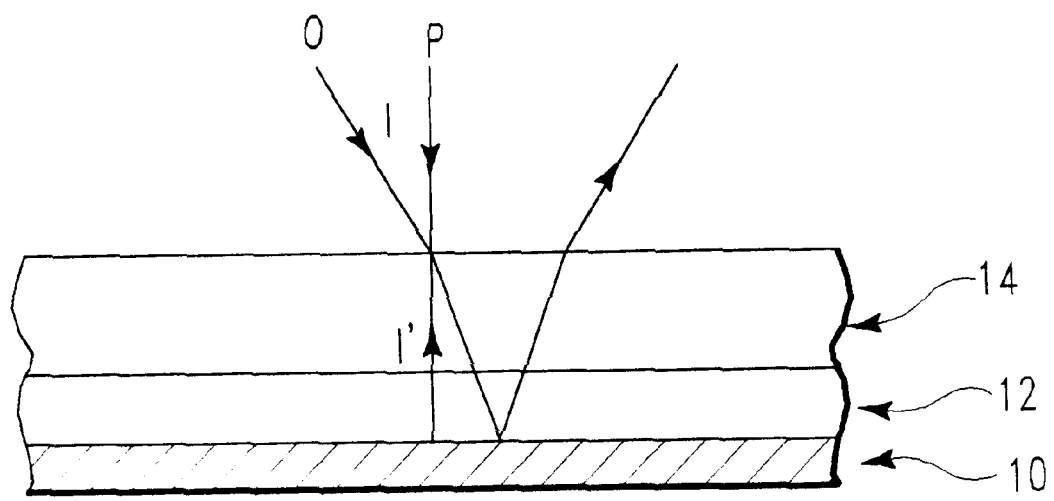
FIG. 1 illustrates the essential features of the phase-averaging resist coating technique resulting in a full-wave lag in the oblique rays compared to the normal-incident rays upon reflection.

This invention provides a novel method and resist coating compositions for controlling linewidth variations by reducing thin film interference effects. Of paramount importance to this method is the fact that modern steppers have relatively large numerical apertures in their objective lens, and utilize only partially coherent illumination in their condenser system. This provides illumination with a significant cone-angle at the wafer plane. Consequently, a large fraction of imaging light consists of oblique rays produced by diffraction orders of one or greater. For example using, a conventional i-line (365 nm wavelength) stepper with a numerical aperture (NA) of 0.35, diffraction orders from the mask which completely fill the entrance pupil will arrive at the resist surface at a 20° angle of incidence as seen in FIG. 1.

Therefore in order to realize sufficient phase averaging to dampen thin film interference, requires making the resist coating optically thick enough so that a full-wave phase lag accumulates in the oblique rays compared to the normal incident rays upon reflection from the substrate and arriving back at the resist surface. Such a full-wave phase lag assures that the rays arriving at angles intermediate between the normal and the limited obliquity will be delayed by an amount ranging from zero to one full wavelength in phase, relative to the normally incident rays; thus providing the greatest degree of phase averaging.

Figure 2:
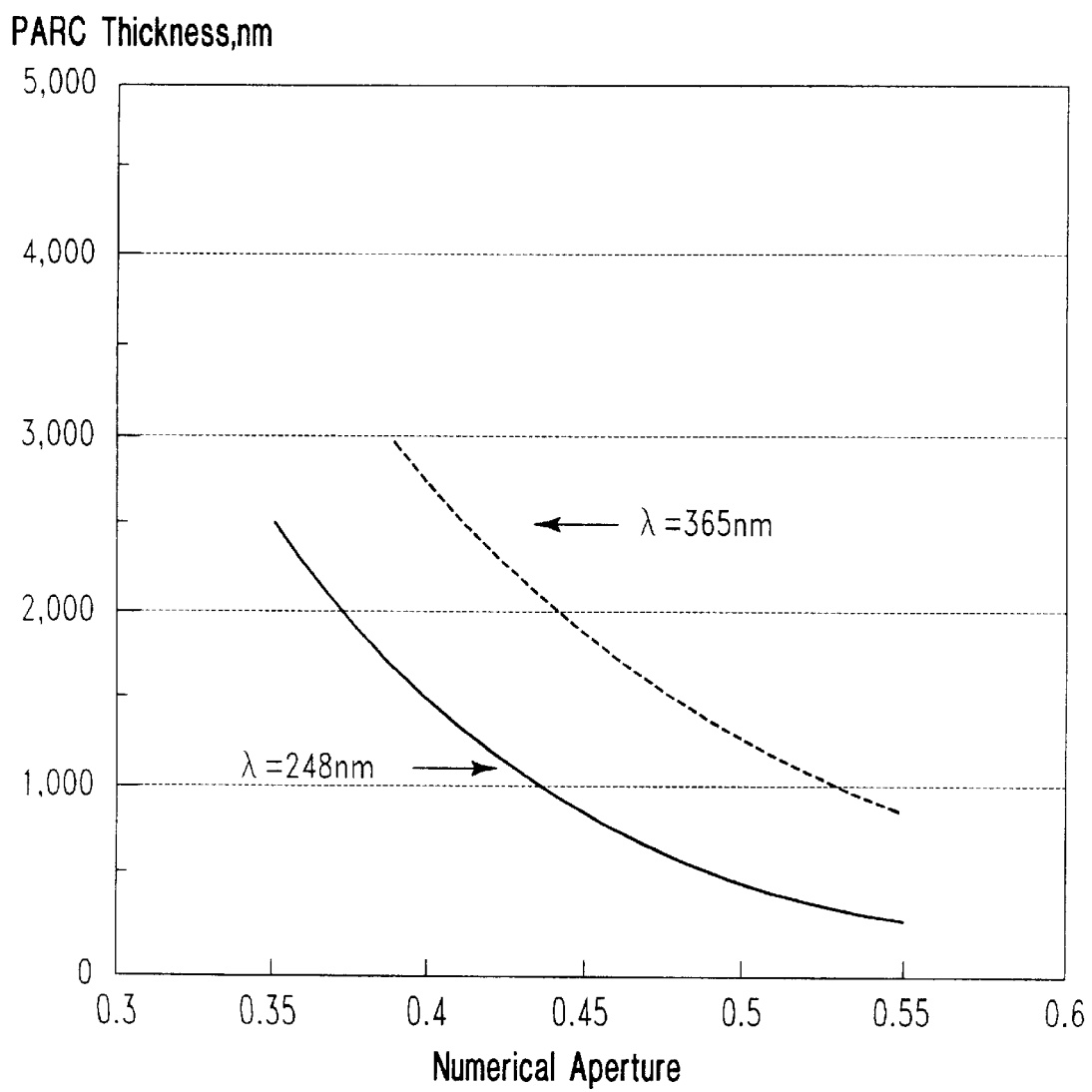
FIG. 2 illustrates the means of calculating phase-average resist coating thickness for different numerical aperture values and wavelengths, employing a resist thickness of 1000 nm and an index of refraction of 1.7.

Sufficient phase averaging to dampen thin film interference can be achieved by overcoating the resist with a layer of transparent material having a refractive index similar to the resist. FIG. 1 illustrates the essential features of the phase-averaging resist coating technique. As seen, ray "O" arrives at the film surface making angle I=arcsin (Numerical Aperture) with the normal. Ray "P" arrives at normal incidence. If we assume that both the phase average resist coating 14 having a thickness $T_2$ and the resist film 12 having a thickness $T_1$ have nearly the same index of refraction (N), then ray "P" traverses a path length of $2N(T_1+T_2)$ upon reflection from the substrate. Ray "O" traverses a pathway of $2N(T_1+T_2)/\cos I'$, where $I'$=arc sin (I/N), the angle of refraction of ray "O" in the composite film. Therefore in order to accumulate a full-wave phase lag in ray "O" compared to ray "P", therefore requires a phase-averaging resist coating thickness of $T_2=L/2N\{\cos I'/(1-\cos I)\}-T_1$, where $T_1$ is the resist thickness and L is the wavelength. Thus (FIG. 2) assuming an numerical aperture (NA) of 0.35, a resist thickness of 1000 nm and a refractive index of 1.7 then the phase averaging resist coating (PARC) thickness of about 4000 nm provides sufficient path-length for a full-phase lag of oblique rays. PARC thickness calculated for other numerical aperture values and exposure wave lengths are shown in FIG. 2.

In order to implement this approach requires, a polymeric phase-averaging resist coating (PARC) which can be applied without attack on the underlying photoresist. Additionally, such a coating must be extremely transparent at the exposure wavelength and is strippable in conventional aqueous developer solutions. It has been determined that polyacrylic acid (PAA) or its copolymers, spin applied from an aqueous solution, meets these qualifications. Polyacrylic acid is an excellent film former, is soluble both in water and alkaline developer solutions and transmits to well below 250 nm. Although, polyacrylic acid (N) refractive index of 1.5 is not exactly matched to that of the photoresist layer, which is 1.7(N), it is still close enough to demonstrate the dramatic effect on reduction of linewidth swings.

In addition to polyacrylic acid (PARC) coatings, higher and lower molecular weight water soluble homopolymers of acrylic acid and methacrylic acid along with their copolymers with other third monomers, can function within the scope of this invention.

One may also employ acrylic acid and or copolymers of methacrylic acid with one or more optional comonomers including, vinyl alcohol, vinyl esters of carboxylic acids such as vinyl acetate, vinyl butyrate; the $C_1$ to $C_{20}$ alkyl esters of acrylic acid and methacrylic acid such as methyl methacrylate, 2-ethylhexyl acrylate and lauryl acrylate; aryl halo- and nitro-substituted benzyl esters of acrylic and methacrylic acid such as benzyl acrylate and 2-chloro-benzyl acrylate; ethylenically unsaturated dicarboxylic acids, their anhydrides and their $C_1$ to $C_{20}$ mono- and dialkyl esters such as aconitic acid, fumeric acid, maleic acid, itaconic acid, citraconic acid, maleic anhydride, dibutyl fumarate and monoethyl maleate; amides of ethylenically unsaturated carboxylic acids such as acrylamide and methacrylamide; vinyl aryl compounds such as styrene and alpha-methyl styrene; nitriles of ethylenically unsaturated carboxylic acids such as acrylonitrile and methacrylonitrile; $C_1$ to $C_{20}$ alkyl vinyl ethers such as methyl vinyl ether, ethyl vinyl ether; and glycidyl esters of acrylic and methacrylic acid such as glycidyl acrylate and glycidyl methacrylate.

Preferred for use as optional comonomers with either acrylic acid and/or methacrylic acid are methyl, butyl or hexyl acrylates, vinyl acetate and vinyl alcohol. With respect to proportions, the polymers which can function effectively as a coating in this method, may contain up to 99% by weight, of one or more of the above described comonomers in conjunction with acrylic acid and/or methacrylic acid.

Specific homo and copolymer compositions which have been found to provide desired results as phase-averaging resist coatings are: acrylic acid, methacrylic acid, vinyl alcohol and vinyl acetate.

The following examples are given simply to illustrate this invention and not in any way to limit its scope. While the examples given are based on a chemically amplified resist it is not limited to such resists and is applicable all resist materials.

EXAMPLE I

A series of photoresist coatings of varying thickness, ranging from 900 nm to 1000 nm, were prepared by the spin coating technique. The resists were prepared from a solution of a 18 grams of poly (4-t-butoxycarbonyloxystyrene-co-4-hydroxystyrene) (PBOCST-PHOST) resin made in accordance with the disclosure of U.S. Pat. No. 264,407 (the disclosure of which is hereby incorporated by reference into the present application) 80 grams of polyethyene glycol methyl ether acetate( PMA) solvent and 2 grams of trifluoromethylsulfonyl oxycyclo-[2.2.1.]-hept- 5-ene 2,3-dicarboximide (MDT), which is made in accordance with U.S. patent application Ser. No. 322,848 (the disclosure of which is hereby incorporated by reference) photosensitizer. In each case the coated silicon wafers were then baked between 70° and 100° C., preferably at 90° C., for 1 minutes on a hot plate to yield a 900–1000 nm film.

EXAMPLE II

The resist coated wafers were then image exposed through a chrome mask image on a KrF excimer laser stepper at a wavelength 248 nm monochromatic exposure.

The wafers were then given another 90 second post exposure bake again at 90° C. for one minute. The exposed photoresist covered wafer was then immersed in a 0.21N aqueous tetramethyl ammonium hydroxide developer (TMAH) solution for 60 seconds at 22° C. The wafers were then removed from the developer bath, washed in deionized water and dried.

EXAMPLE III

A similar series of varying thickness photoresist were prepared as in Example I from the following components:

Cresol-formaldehyde Novolak resin—14.5 grams

Bis DQTD—3.5 grams

Propylene glycol monomethyl ether acetate—such that the total solids content was about 20 weight percent of the composition.

EXAMPLE IV

The RESIST coated wafers from example III were then image exposed through a chrome mask image on a i-line stepper at a wavelength 365 nm monochromatic exposure.

The coated wafer was given another 90 second post exposure bake again at 90° C. The exposed photoresist covered wafer was then immersed in a 0.21N aqueous tetramethyl ammonium hydroxide developer (TMAH) solution for 60 seconds at 22° C. The wafers were then removed from the developer bath, washed in deionized water and dried.

EXAMPLE V

The resists from example I which is subsequently PARC over-coated in the following manner.

A 40% by weight aqueous solution of polyacrylic acid having a molecular weight of about 5000, was then spin coated at 3000 rpm onto a resist described above to yield a 2000 nm film topcoat (full wave thickness at 248 nm, and a Numerical Aperture=0.37). This phase averaging resist coated wafer, were imaged at 20 mJ on a Canon FPA excimer laser stepper having a Numerical Aperture (NA) of 0.37. The PARC layer was then stripped in water, and the wafers baked at 110° C. to complete imaging. After a 60 second immersion development in 0.21N aqueous tetramethyl ammonium hydroxide developer, the wafers were cleaved and SEM measurements were taken to determine 0.5μm linewidth variations as a function of resist thickness (swing curve).

EXAMPLE VI

The novolak resist from example III which is subsequently PARC over-coated in the following manner.

A 40% by weight aqueous solution of polyacrylic acid having a molecular weight of about 5000, was then spin coated at 3000 rpm onto a resist described above to yield a 2000 nm film topcoat (full wave thickness at 248 nm, and a Numerical Aperture=0.37). This phase averaging resist coated wafer, were imaged at 20 mJ on a Canon FPA excimer laser stepper having a Numerical Aperture (NA) of 0.37. The PARC layer was then stripped in water, and the wafers baked at 110° C. to complete imaging. After a 60 second immersion development in 0.21N aqueous tetramethyl ammonium hydroxide developer, the wafers were cleaved and SEM measurements were taken to determine 0.5 μm linewidth variations as a function of resist thickness (swing curve).

Figure 3:
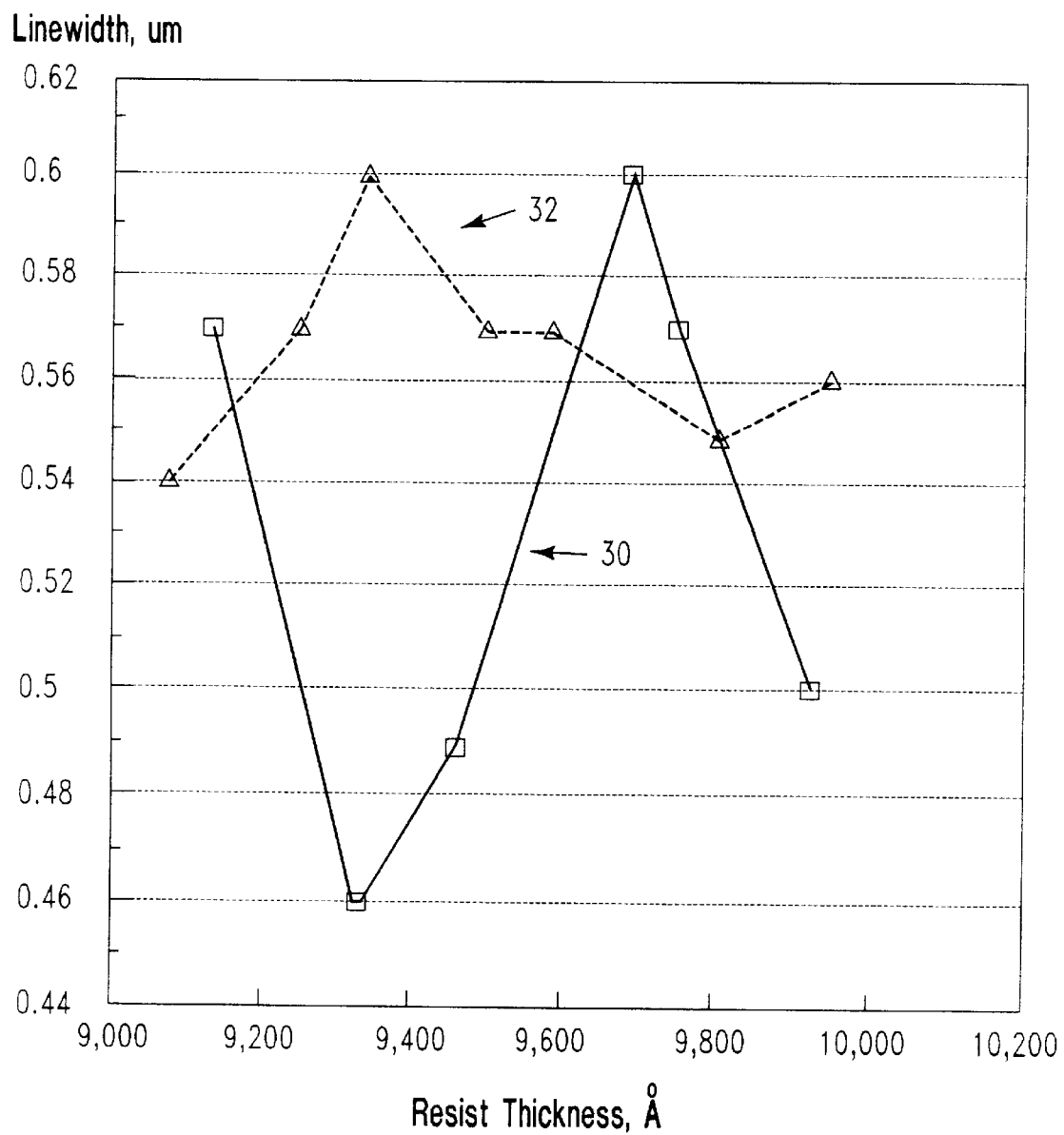
FIG. 3 illustrates the effect of reduction of linewidth variation (damping effect) with and without and the phase average resist coating as a function of resist thickness, hereafter described.

FIG. 3 represents a comparison of total linewidth variations resulting from interference, when comparing the control resists 30 of Example II, at various thickness, with the comparable PARC overcoated samples 32 of Example V.

Total linewidth variations are measured by the deviation from the desired line width on single exposure or the mean of the line width obtained from a range of thickness values. In the case of the polyacrylic acid coated resists from example V, the total linewidth swing or variation as compared to a non uncoated resists of Example III, represented 26% linewidth swing or variation; while the similar resists coated with the 2000 nm thickness polyacrylic PARC as prepared in Example V, exhibited only a swing of 11%. This example demonstrates the feasibility of the PARC technique in (Damping) reducing swing effects in linewidth arising from thin film interference.

What is claimed:

1. A method of reducing linewidth variations in the patterning of a photoresist layer having a non-uniform thickness in a photolithographic process using light from a partially coherent lens, said method comprising: overcoating a first layer comprising a photoresist composition with a second layer comprising a non-reactive, transparent, water soluble material with a refractive index within ±15% of the refractive index of the photoresist, the second, overcoating, layer of water soluble material being of sufficient thickness to cause about a one wave length phase delay to accumulate in that portion of the exposing light having an incident angle to the second layer upper surface equal to about the arccos of the numerical lens aperture value, said phase delay being in comparison to that portion of the exposing light having an incident angle normal to the second layer upper surface, wherein said phase delay accumulates upon traversing an optical path from the photoresist layer upper surface to the photoresist layer lower surface and reflecting back to the photoresist layer upper surface.

2. The method of claim 1 where said photoresist has a refractive index in the range of 1.5 to 1.9.

3. The method of claim 2 where the overcoating, water soluble material of the second layer is selected from the class consisting of polyacrylic acid or polymethacrylic acid homopolymers, copolymers, and terpolymers.

4. The method of claim 2 where said photoresist has a thickness of between 200 to 20,000 nm.

5. The method of claim 3 where the second, overcoating layer has a thickness in the range from about from 500 to 5000 nm and the water soluble material comprising the second, overcoating, layer has a molecular weight in the range from 1000 to 500,000.

6. The method of claim 3 wherein the overheating, water soluble material is polyacrylic acid with a thickness of about 2000 nm and an index of refraction of 1.5.

7. The method of claim 3 wherein the overcoating water soluble material is polyacrylic acid with a molecular weight of 2,000 to 10,000.

8. The method of claim 3 wherein the overcoating, water soluble material is polyacrylic acid with a molecular weight of 5000.

9. The method of claim 3 wherein the overcoating, water soluble material is a copolymer of acrylic acid and a alkylacrylate or alkyl methacrylate.

10. The method of claim 3 wherein the overcoating, water soluble material is a copolymer of acrylic acid, methacrylic acid and an alkyl acrylate or alkyl methacrylate.

11. The method of claim 3 wherein the overcoating, water soluble material is a copolymer of acrylic acid and monomers selected from the group consisting of vinyl acetate, vinyl alcohol, butyl acrylate, hexylacrylate, methyl acrylate and methyl methacrylate.

* * * * *